United States Patent [19]

Bates et al.

[11] Patent Number: 4,892,617

[45] Date of Patent: Jan. 9, 1990

[54] PROCESSES INVOLVING LITHOGRAPHIC MATERIALS

[75] Inventors: Frank S. Bates, Summit; Mark A. Hartney, Westfield; Anthony E. Novembre, Union City, all of N.J.

[73] Assignee: American Telephone & Telegraph Company, AT&T Bell Laboratories, Murray Hill, N.J.

[21] Appl. No.: 110,630

[22] Filed: Oct. 19, 1987

Related U.S. Application Data

[63] Continuation of Ser. No. 643,156, Aug. 22, 1984, abandoned.

[51] Int. Cl.[4] ............................ B44C 1/22; G03C 5/00
[52] U.S. Cl. ................................ 156/659.1; 156/662; 430/272; 430/313; 430/317
[58] Field of Search ................. 156/643, 662, 659.1, 156/664; 427/43.1; 430/270, 272, 281, 502, 317, 503, 508, 905, 313, 314, 323

[56] References Cited

U.S. PATENT DOCUMENTS

| | | | |
|---|---|---|---|
| 3,794,510 | 2/1974 | Scala et al. | 156/662 X |
| 3,951,709 | 4/1976 | Jacob | 156/643 |
| 3,969,543 | 7/1976 | Roberts et al. | 430/272 X |
| 4,061,799 | 12/1977 | Brewer | 156/643 X |
| 4,078,927 | 3/1978 | Amidon et al. | 430/67 X |
| 4,286,049 | 8/1981 | Imamura et al. | 430/270 X |
| 4,323,636 | 4/1982 | Chen | 430/281 X |
| 4,464,460 | 8/1984 | Hiraoka et al. | 156/659.1 X |
| 4,481,049 | 11/1984 | Reichmanis et al. | 156/659.1 X |
| 4,521,274 | 6/1985 | Reichmanis et al. | 156/659.1 X |
| 4,551,417 | 11/1985 | Suzuki et al. | 156/659.1 X |

FOREIGN PATENT DOCUMENTS 0122398 10/1984 European Pat. Off. .
2613603 10/1976 Fed. Rep. of Germany .

OTHER PUBLICATIONS

Morita et al., "High Resolution Double Layer Resist System Using New Silicone Based Negative Resist (SNR)", *Japanese Journal of Applied Physics*, vol. 22, No. 10, part 2, Oct. 1983, pp. 659-660.

Suzuki et al., "Copolymers of Trimethylsilylstyrene with Chloromethylstyrene for a Bi-Layer Resist System", *Journal of the Electrochemical Society*, vol. 130, No. 9, Sep. 1983, pp. 1962-1964.

Choong et al., "Molecular Parameters and Lithographic Performance of Poly(Chloromethylstyrene) . . . ", *J. Vac. Sci. Technol.*, vol. 19, No. 4, Nov./Dec. 1981, pp. 1121-1126.

Roberts, E. D., "Recent Developments in Electron Resists", *Solid State Technology*, vol. 27, No. 6, Jun. 1984, pp. 135-141.

Jackson, G. N., "RF Sputtering", *Thin Solid Films*, 5 (1970), No. 4, pp. 227-230.

*Primary Examiner*—Raymond Hoch
*Attorney, Agent, or Firm*—Bruce S. Schneider

[57] ABSTRACT

Extremely useful compositions for delineation of materials utilized in device applications have been found. These compositions include a polymer having segments that are at least 10 monomer units long of a first entity and segments again at least 10 monomer units long of a second entity. The monomer units are chosen so that each segment type provides a specific chemical characteristic to the polymer.

6 Claims, 1 Drawing Sheet

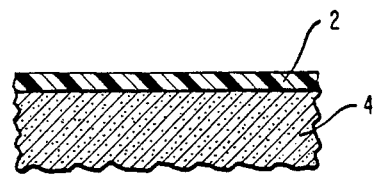

PROCESSES INVOLVING LITHOGRAPHIC MATERIALS

This application is a continuation of application Ser. No. 643,156 filed Aug. 22, 1984 now abandoned.

BACKGROUND OF THE INVENTION

1. Field of the Invention

This invention relates to the fabrication of devices and, in particular, the fabrication of devices involving lithographic procedures.

2. Art Background

Lithographic techniques are widely practiced in the manufacture of devices such as semiconductor devices. These techniques rely on a mask material that is deposited on a substrate, delineated into a specific pattern, and subsequently utilized to form a particular device structure. (Substrate, for the purposes of this disclosure, is a body, e.g., a semiconductor body, that is being processed into a device, e.g., a semiconductor device. This body could include not only semiconductor materials or optoelectronic materials, but also regions of organic materials, metals, and dielectrics.) Often a mask material to be adequate for a specific application is required to have several distinct chemical properties. (A chemical property, for purposes of this disclosure, is a property that depends on the reactivity or lack of reactivity of a composition under the influence of heat, radiation, and/or chemical agents. Reactivity in this context includes decomposition.)

An example of an application requiring multiple properties involves a contemplated bilevel resist including (1) a lower layer that contacts the substrate and that is susceptible to removal by contact with an oxygen reactive ion etching (RIE) environment and (2) an upper layer overlying this lower layer that is lithographically defined but essentially unaffected, relative to the lower layer, by oxygen RIE, i.e., etches in an RIE oxygen environment at a rate at least 5 times, preferably 10 times, less than the lower layer. In use, the upper layer is lithographically defined, and the exposed regions of the lower layer are then removed by interaction with an oxygen RIE environment. Because the upper layer is oxygen RIE resistant, it is not substantially removed during the removal of the exposed regions of the lower layer. Thus, an exemplary multiple property lithographic material is a composition that is both lithographically definable by exposure to a nominal dose of radiation, e.g., electromagnetic radiation, and also oxygen RIE resistant. Although materials have been developed that satisfy these two requirements, such development is quite difficult and only a limited number of satisfactory materials has been found.

Similarly, there are many other materials required for lithography which, because of specific use parameters, have extremely demanding chemical property requisites. A unified approach to developing such materials has not been found and, indeed, often materials satisfying combined chemical property requirements are not forthcoming.

SUMMARY OF THE INVENTION

The complex demands of lithography involving requirements for multiple chemical property compositions are approachable through the use in device fabrication of specific polymers. These polymers include at least a first and second segment that in turn each includes at least 10 units of building block monomer(s), i.e., chemical entity (entities) reacted to form the segment. The composition of the first segment is chosen to yield a first chemical property, and the composition of the second segment is chosen to yield a second distinct chemical property. Surprisingly, the chemical property of each individual segment is not diminished by the presence of the second segment. Further, the material, even over typical lithographic exposure areas, e.g., areas in the range 0.1 $\mu$m to 50 $\mu$m, has the properties attributable to all the segments. These combined properties are surprisingly achieved even though blends of separate polymers each compositionally corresponding to an individual segment do not yield such a result. Exemplary of such materials is a polymer having segments formed from chlorinated methylstyrene units and segments formed from dimethylsiloxane units. This material exhibits both the high sensitivity characteristics of chlorinated polymethylstyrene and the oxygen RIE-resistant characteristic of polydimethylsiloxane.

Since compositions having combined chemical properties are producible from a variety of known and contemplated entities, each having but one desired chemical property, polymers having the combined properties are significantly easier to design and produce. Individual units having individual properties are easily discernible from treatises such as *Introduction to Microlithography*, American Chemical Society Symposium Series 219, L. F. Thompson et al, pages 87–161 (1983), and thus the final multiple segment polymers are easily designed and synthesized.

BRIEF DESCRIPTION OF THE DRAWING

The Figure is illustrative of bodies employed in the invention.

DETAILED DESCRIPTION

The inventive device fabrication procedure involves a sequence of steps including at least one lithographic step. Device fabrication sequences including lithographic procedures, i.e., the exposure and patterning of delineable materials—resist materials—have been widely described in treatises such as VLSI Technology, S. M. Sze, McGraw-Hill, New York (1983) and Thompson et al supra.

The various conditions utilized to expose and delineate, e.g., develop, the materials employed in the lithographic step of the inventive device fabrication procedure depend on the segments employed in the resist material and the desired properties that they impart. For example, if a segment is utilized because it yields a desired sensitivity to a particular type radiation, then this radiation should preferably be utilized for such exposure. If none of the segments are employed specifically for exposure sensitivity, then suitable radiation for exposing any of the segments is employable. However, when light is employed as the exposing radiation, the wavelength at which the most desirable sensitivity is achieved sometimes does not correpond precisely with the equivalent wavelength for a given segment. In such a circumstance, an appropriate wavelength is determined as described in Thompson et al supra, pages 88–106 and 145–154. Similarly, the particular development technique utilized depends on the purpose for which the segments are chosen. If a segment is chosen specifically to yield a desirable removal rate in a particular medium, e.g., plasma or solvent, then this medium should preferably be employed. However, if the segments are not chosen specifically to give a particular removal rate, then a medium is chosen as described in Thompson et al supra, pages 162-212. A treatise indicating appropriate radiation and/or wavelengths for particular segments and suitable removal media is Thompson et al supra, pages 88-212. (This treatise lists polymers, not segments. However, the properties associated with a particular polymer for purposes of determining appropriate processing conditions are ascribable to a segment formed from the essentially same monomer units in essentially the same proportion.)

As discussed, the lithographic material utilized in the inventive device fabrication procedure includes a polymer having segments formed from monomer units. In particular, each segment type with its monomer units is chosen to give a specific chemical property to the polymer. The invention is not limited to the presence of two types of segments yielding specific chemical properties but is expandable to a number of properties afforded by a corresponding number of segment types, provided a sufficient amount of each segment is present. For a particular constituent segment to impart a desired property to the polymeric material, it should constitute at least 2 mole percent of the entire polymer. That is, the sum of the molecular weights of all segments of a particular monomer compositional type should constitute at least 2 mole percent of the polymer. Additionally, any segment to be included in the molecular weight sum for this determination should have at least 10 monomer units of at least one monomer.

The desired polymers are expeditiously formed by various well-known techniques such as anionic, free radical, cationic, and/or condensation polymerization. (See *Macromolecules*, Bovey and Winslow, editors, Academic Press, New York, pages 23-202 (1979), and *Principles of Polymerization*, G. Odian, McGraw-Hill, New York (1970).) For example, each type segment is first produced with at least 10 monomer units of a specific moiety (although the inclusion of other monomers in addition to the at least 10 required monomer units is not precluded) and then preformed segments of the various types are copolymerized. Procedures termed anionic (living) polymerization are extremely useful. These techniques involve forming at least one segment in situ in the presence of a second segment and bonding the growing segment to the preformed one. It is possible then to add further segments of different types by repeating this procedure. (See *Carbanions, Living Polymers, and Electron Transfer Processes*, M. Szwarc, Wiley & Sons, pages 73-97 (1968).) Irrespective of the polymerization technique, it is also possible to further modify the polymer, such as by chlorination, to enhance certain properties such as sensitivity to radiation.

Exemplary of a suitable polymer is one containing first segments formed by anionic polymerization of methylstyrene units initiated with butyl lithium, which segments are reacted with hexamethylcyclotrisiloxane to form a two-segment polymer of methylstyrene-dimethylsiloxane. Subsequently, it is possible to form a polymer containing two methylstyrene segments by reacting the 'living' two-segment polymer with dichlorodimethylsilane. The specific conditions of the polymerization, e.g., solvent, temperature, and initiator, depend on the particular segments employed and are generally determined through use of a controlled sample. Typical initiators are organometallics such as butyl lithium. Temperatures in the range 0 degrees C to 100 degrees C are generally employed. Additionally, useful solvents for the reaction are found in Szwarc supra, pages 151-210. The conditions are producing segments of a particular number of monomer units are determined through the use of a series of samples indicating the particular molecular weight that is obtained for given reaction conditions. (See Textbook of Polymer Science, Billmeyer, Wiley & Sons, New York (1971), and Bovey and Winslow supra, pages 23-202, for a general description, in a different context, of the formation of segments containing monomer units for a wide variety of moieties.)

Typically, the molecular weight of each segment should be in the range between 500 to 10,000,000. Molecular weights larger than 10,000,000 typically lead to extremely high viscosity and low dissolution rates and thus significantly impede processing. Molecular weights less than 500 generally result in inadequate lithographic sensitivity.

Typically, in device formation, the polymeric material containing the desired segments is dissolved in a suitable solvent and formed in a layer, 2, on a substrate, by conventional techniques such as spinning. (See Thompson et al supra, paages 186-195, for a description of spinning.) The lithographic layer is formed on the substrate for a variety of purposes such as ion implantation, metallization, and etching. In each application, the material is delineated by exposure to radiation, e.g., electrons or light, to induce a change in the exposed portions of the material. The delineated material is then developed generally by subjecting the material to an environment that removes either the unexposed portion in the case of a negative acting material or the exposed portion in the case of a positive acting material. Removal media utilized for this purpose include liquid solvents and plasmas such as radio frequency plasmas. After the resist material is delineated, device processing such as ion implantation, metallization, and/or etching, e.g., wet chemical and dry etching, that rely on this delineated resist is then performed. Subsequently, the resist is removed by procedures such as etching and/or plasma stripping, and the device fabrication is completed.

The following examples are illustrative of materials useful for the inventive process of fabricating devices.

EXAMPLE 1

A 2 liter reactor having a gas inlet and an inlet for introducing reagents was alternately evacuated and flushed for 10 minutes with purified argon introduced through the gas inlet. Approximately 500 ml of benzene, 0.46 ml of anisole, 0.89 ml of n-butyl lithium (1.6 molar in hexane), and 56.7 grams of methylstyrene were sequentially added to the reactor. (The methylstyrene was purified before reaction by combining it with dibutyl magnesium and extracting the methylstyrene by vacuum distillation. The benzene was purified before use by combining it with polystyryllithium and separating the benzene by distillation. Both purifications were conducted in an argon atmosphere.) The reaction mixture was stirred utilizing a Teflon ® coated magnetic stirring bar and heated to a temperature of approximately 50 degrees C. The mixture was maintained at 50 degrees C for 1 hour and then cooled to 30 degrees C. Approximately 1 ml of dimethoxyethane (purified before use under argon by combination with polystyryllithium and subsequent distillation) was added in 1 aliquot to the reaction mixture. Approximately 25 ml of a benzene solution containing 16.6 grams of hexamethylcyclotrisiloxane (purified before use by combination under argon with dibutyl magnesium and subsequent sublimation) was prepared. This solution was added to the reaction vessel through a stainless steel tube using an argon overpressure and then 25 ml of dimethoxyethane was also introduced. The reaction was continued at 30 degrees C for 11 ½ hours. Approximately 0.09 ml of dimethyldichlorosilane was added to the reaction mixture, and after 5 minutes this mixture was washed with 200 ml of a 10 percent by weight/volume aqueous solution of sodium bicarbonate. The product in the organic fraction was then precipitated by introducing this fraction into an excess of methanol. The resulting precipitate was dried under vacuum for several days. The product was analyzed by elemental anaylsis and contained 11 percent by weight of dimethylsiloxane segments and 89 percent by weight of methylstyrene segments.

EXAMPLE 2

The procedure of Example 1 was followed except the proportions of various reactants were changed to change the relative amounts of dimethylsiloxane and methylstyrene segments present in the final product. The initial reaction mixture contained 300 ml of benzene, 0.45 ml of n-butyl lithium (1.52 molar in hexane), and 25.5 grams of methylstyrene. After reaction, 2 ml rather than 1 ml of dimethoxyethane was added. The subsequently introduced hexamethylcyclotrisiloxane solution included 42.4 grams of this material in 200 ml of benzene. This solution was added dropwise, together with 50 ml of dimethoxyethane, over a 10 minute period. The reaction was continued for 24 hours and then 0.045 ml of dimethyldichlorosilane was added. After 1 hour, the reaction mixture was washed, precipitated, and dried. This procedure yielded 51.5 grams of a polymer containing 50 percent by weight dimethylsiloxane segments and 50 percent methylstyrene segments.

EXAMPLE 3

A 500 ml reactor that was fitted with an addition funnel, a reflux condenser, and a gas inlet was flushed with dry nitrogen for 1 hour. Approximately 3.75 grams of the Example 1 product was introduced into the reactor. Approximately 0.80 grams of azobisisobutyronitrile and 40 ml of carbon tetrachloride were added. The resulting solution was heated to 60 degrees C under a nitrogen flow and held at this temperature for 40 minutes. A solution containing 1.6 ml of sulfuryl chloride and 1.8 grams of azobisisobutyronitrile in 40 ml of carbon tetrachloride was prepared and then added dropwise over a 10 minute period to the reaction mixture. The mixture was maintained at 60 degrees C for 75 minutes and then a 300 ml aliquot of aqueous sodium bicarbonate solution (10 percent by weight/volume) was added. The organic layer was separated, and precipitation was induced by introducing this material into methanol. The resulting precipitate was washed with methanol, washed with water, and dried overnight under vacuum. Approximately 3.93 grams of a chlorinated polymer (13.65 percent chlorine by weight) was recovered.

EXAMPLE 4

The procedure of Example 3 was followed except that the initial reaction mixture was formed by combining 5.3 grams of the polymer produced in Example 2 with 0.8 grams of azobisisobutyronitrile in 50 ml of carbon tetrachloride. Additionally, the solution added dropwise was 1.26 ml of sulfuryl chloride and 1.8 grams of azobisisobutyronitrile in 40 ml of carbon tetrachloride. The solution was added over a period of 20 minutes, and the reaction was continued for 65 minutes rather than 75 minutes. A 30 ml aliquot of sodium bicarbonate was then utilized as a wash. The procedure resulted in 5.45 grams of chlorinated polymer which was 7.6 percent by weight chlorine.

EXAMPLE 5

A 10 percent by weight/volume chlorobenzene solution of the polymer prepared as described in Example 3 and a second 10 percent chlorobenzene solution of the polymer prepared as described in Example 4 were utilized for coating substrates. These solutions were filtered at least three times through a stack including a 1.0 $\mu$m, a 0.5 $\mu$m, and a 0.2 $\mu$m average pore size Teflon® filter. Films were deposited on a 3 inch in diameter silicon substrate by placing a sufficient amount of one solution on the film to produce a 0.5 $\mu$m thick film after spinning between 3000 and 5000 rpm for 1 minute. The coated substrates, prior to exposure, were baked at 100 degrees C under vacuum for 1 hour. The coated substrates were exposed with an electron beam exposure system operating at 20 kV having a beam address and spot size each equal to 0.25 $\mu$m. This exposure consisted of a 10×10 array of linewidth control patterns. The exposure dose for each line in the array was varied so that exposures ranging from 0.1° C./cm$^2$ to 10° C./cm$^2$ were utilized. After exposure, the samples were maintained in vacuum for 10 minutes.

The exposed substrates were spray developed using an APT Model 915 electron beam resist processor. The developing conditions includes spinning the substrate at 100 rpm while subjecting it to a series of 28 psi sprays. The sequence of sprays employed was a solution of 5 parts methyl ethyl ketone and 1 part ethanol for 30 seconds followed by a 20-second rinse of isopropanol. The substrate was then spun for 30 seconds at 1450 rpm under cold, dry nitrogen to induce drying.

The patterned substrates were baked in vacuum at 125 degrees C for 45 minutes. Film thickness as a function of exposure dose was measured optically using a Nanometrics Nanospec/AFT® microarea thickness gauge. A graph of film thickness remaining versus the log of the incident exposure dose was prepared. Sensitivity and contrast were taken as the dose required to crosslink a film half the thickness of the unexposed film and the slope of the graph over its linear region, respectively. A sensitivity of 2.1° C./cm$^2$ and a contrast of 1.6 were obtained for the material of Example 3, while a sensitivity of 0.8° C./cm$^2$ and a contrast of 1.2 were obtained for the material of Example 4.

EXAMPLE 6

Coated substrates were prepared as described in Example 5. These substrates were reactively ion etched by placing them in the center of the plexiglass covered cathode of an RIE parallel plate reactor. The cathode was maintained at approximately 15 degrees C, and the reactor was evacuated to a pressure of approximately 0.05 $\mu$m. Oxygen was introduced at a flow rate of approximately 17 sccm to yield a pressure of approximately 1.5 $\mu$m. A plasma was struck using an r.f. power of 150 watts and a bias voltage of 480 volts with a reflect power of approximately 2 watts. Etching was continued for approximately 15 minutes. Film thickness measurements were made, as previously described, using a Nanospec before and after etching. The resulting measurements indicated etch rates of approximately 300 and 25 Angstroms/minute for the materials of Examples 1 and 2, respectively. Thus, the etch rate ratios for each material relative to the Hunt photoresist HPR-204 were, respectively, 1.5 and 19.

EXAMPLE 7

Silicon substrates, 3 inches in diameter, were spin coated with a layer of approximately 1.5 μm of Hunt photoresist HPR-204. This resist layer was baked at 200 degrees C in air for 2 hours. A 0.4 μm film was then formed on the coated substrate as described in Example 5, except the spinning solvent was chlorobenzene rather than ethyl acetate. The substrate was then baked at 150 degrees C under forced air for 30 minutes. The upper resist layer was exposed as described in Example 5. The upper resist layer was developed using methyl ethyl ketone/ethanol at a ratio of 3:1 and baked at 210 degrees C for 60 minutes in air. The patterns defined in the polymer layer were initially cleaned using a $CH_4/O_4/He$ (mole ratio of 49:1:50) RIE discharge for 2 minutes. The power, pressure, and gas flow rate were 100 watts, 7.5 μm, and 82 sccm, respectively. The patterns defined in the polymer layer were then transferred to the underlying HPR-204 layer by RIE under the conditions described in Example 6 for 50 minutes. This procedure resulted in a pattern having half-micron line and space gratings as a minimum feature size.

What is claimed is:

1. A process for fabricating a structure comprising the steps of forming a region of radiation delineable material on a substrate, delineating said material by exposing the material to a pattern of radiation and developing the pattern and employing said delineated material as a dry etch mask to transfer said pattern to said substrate in continuing said fabrication.

CHARACTERIZED IN THAT said material comprises a polymer including at least a first and second segment, said first and second segments each imparting a distinct chemical property to said polymer wherein each segment includes at least 10 monomer units, wherein said first and second segments are compositionally different, and wherein the distinct chemical property of the first segment is chosen to improve the step of delineating said material and the distinct chemical property of the second segment is chosen to improve the said dry etch transfer.

2. The process of claim 1 wherein said substrate comprises silicon.

3. The process of claim 1 wherein said segments have a molecular weight in the range 500 to 10,000,000.

4. The process of claim 1 wherein said step of continuing said fabrication includes a procedure chosen from the group consisting of etching, metallization, and ion implantation.

5. The process of claim 4 wherein said etch comprises a procedure employing a plasma.

6. The process of claim 1 wherein said monomer unit of said first segment comprises dimethylsiloxane and wherein said monomer unit of said second segment comprises a chlorinated methylstyrene.

* * * * *

UNITED STATES PATENT AND TRADEMARK OFFICE
CERTIFICATE OF CORRECTION

PATENT NO. : 4,892,617

DATED : January 9, 1990

INVENTOR(S) : F. S. Bates, M. A. Hartney, A. E. Novembre

It is certified that error appears in the above-identified patent and that said Letters Patent is hereby corrected as shown below:

Column 4, line 2, "are" should be --for--.
Column 4, line 21 "substrate," should read --substrate, 4--.
Column 4, line 47 "2" should read --1--.
Column 6, line 30, two occurrences "C./cm$^2$" should read --$\mu$C/cm$^2$--.
Column 6, line 35 "includes" should read --included--.
Column 6, line 51 "C./cm$^2$" should read --$\mu$C/cm$^2$--.
Column 6, line 53 "C./cm$^2$" should read --$\mu$C/cm$^2$--.
Column 6, line 67 "reflect" should read --reflected--.

Signed and Sealed this

Second Day of April, 1991

*Attest:*

HARRY F. MANBECK, JR.

*Attesting Officer*      *Commissioner of Patents and Trademarks*